(12) United States Patent
Conte et al.

(10) Patent No.: US 9,413,380 B2
(45) Date of Patent: Aug. 9, 2016

(54) HIGH PERFORMANCE DIGITAL TO ANALOG CONVERTER

(71) Applicant: STMICROELECTRONICS S.r.l., Agrate Brianza (IT)

(72) Inventors: Antonino Conte, Tremestieri Etneo (IT); Maria Giaquinta, Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/638,246

(22) Filed: Mar. 4, 2015

(65) Prior Publication Data

US 2015/0263758 A1 Sep. 17, 2015

(30) Foreign Application Priority Data

Mar. 14, 2014 (IT) .............................. MI2014A0413

(51) Int. Cl.
| | | |
|---|---|---|
| G11C 16/04 | (2006.01) |
| H03M 1/66 | (2006.01) |
| H03F 1/34 | (2006.01) |
| H03F 3/347 | (2006.01) |
| H03F 3/45 | (2006.01) |
| G11C 16/06 | (2006.01) |

(52) U.S. Cl.
CPC .............. *H03M 1/661* (2013.01); *G11C 16/06* (2013.01); *H03F 1/34* (2013.01); *H03F 3/347* (2013.01); *H03F 3/45475* (2013.01); *H03F 3/45977* (2013.01); *H03F 2200/156* (2013.01); *H03F 2200/375* (2013.01); *H03F 2200/453* (2013.01); *H03F 2203/45101* (2013.01); *H03F 2203/45332* (2013.01); *H03F 2203/45514* (2013.01); *H03F 2203/45546* (2013.01); *H03F 2203/45632* (2013.01)

(58) Field of Classification Search
CPC ...................................................... G11C 16/04
USPC ............................................ 365/185–185.33
See application file for complete search history.

(56) References Cited

U.S. PATENT DOCUMENTS

| | | | | |
|---|---|---|---|---|
| 5,105,373 | A * | 4/1992 | Rumsey .............. | G06F 17/5036 703/13 |
| 5,500,644 | A * | 3/1996 | Denjean .............. | H03M 1/1052 341/120 |
| 7,176,818 | B2 * | 2/2007 | Marino ................ | H03M 1/208 341/143 |
| 7,999,780 | B2 | 8/2011 | Hashimoto et al. | |
| 2003/0128751 | A1 * | 7/2003 | Vandenameele-Lepla .................. | H04L 27/2659 375/229 |
| 2005/0021580 | A1 * | 1/2005 | Swanson .............. | G01R 23/167 708/405 |
| 2005/0038942 | A1 * | 2/2005 | Swanson .............. | G01R 23/167 710/72 |
| 2009/0098845 | A1 * | 4/2009 | Ling ....................... | H04B 1/16 455/233.1 |
| 2011/0140945 | A1 | 6/2011 | Sundblad | |
| 2012/0244826 | A1 * | 9/2012 | Ling ....................... | H04B 1/16 455/251.1 |

* cited by examiner

*Primary Examiner* — Harry W Byrne
(74) *Attorney, Agent, or Firm* — Allen, Dyer, Doppelt, Milbrath & Gilchrist, P.A.

(57) ABSTRACT

A digital-to-analog converter (DAC) may include a conversion block providing a first analog value. The DAC may also include an amplification block for receiving the first analog value and providing a second analog value amplified by an amplification factor. The amplification block may include a first input terminal for receiving the first analog value, a second input terminal, and an output terminal for providing the second analog value. The amplification block may also include a first capacitive element and a second capacitive element. The first and second capacitive elements may determine the amplification factor. The amplification block may further include a control unit for recovering a charge at a first terminal of the second capacitive element, and based thereon, the second analog value.

5 Claims, 3 Drawing Sheets

HIGH PERFORMANCE DIGITAL TO ANALOG CONVERTER

TECHNICAL FIELD

The invention relates to the field of electronics, and more specifically, to flash memory devices.

BACKGROUND

Flash memory devices are used in any application for storing of binary digits (or bits) of information that may be maintained even when the flash memory devices are not powered. In general, each flash memory device comprises a matrix of memory cells. Each memory cell typically comprises a floating gate MOS transistor. Such a transistor has a bulk terminal, a drain terminal, a source terminal, and a control (gate) terminal, similarly to a standard metal oxide semiconductor (MOS) transistor, and a further control (floating gate) region buried in an oxide layer so as to be electrically insulated.

As known, programming operations (electric charges trapped in the floating gate, this condition determining a high threshold voltage of the transistor), erasing operations (floating gate free from electrical charges, this condition determining a low threshold voltage of the transistor), reading operations (transistor being crossed by a conduction current depending on the threshold voltage), soft-programming operations (restoring of depleted memory cells, i.e. memory cells whose transistors, as having threshold voltages below the low threshold voltage, may be in conduction even when not selected), programming verify operations, erasing verify operations, reading verify operations, and soft-programming verify operations may be performed on each memory cell.

The execution of each of these operations (or memory operations) generally requires that the terminals of the floating gate MOS transistor (and particularly the gate and/or bulk terminals thereof) are suitably biased at respective bias voltages.

For example, during the erasing, programming, programming verify, erasing verify, reading verify, and soft-programming verify operations, the bias voltage applied to the gate terminals of the selected memory cells is equal to −10V, 9V, 6.3V, 4.4V, 5.3V and 2.8V, respectively, whereas during the erasing/soft-programming operation the bias voltage applied to the bulk/gate terminals comprises (voltage) pulses having progressively increasing values (for example, from 4V to 10.75V with a 0.3V step, and from 2.5V to 7V with a 0.125V step, respectively).

Therefore, the execution of each one of these operations generally requires that the bias voltages are generated quickly and with high granularity. For this purpose, each flash memory device typically comprises a digital-to-analog converter (hereinafter, DAC, "Digital (to) Analog Converter" converter) for generating the bias voltage from a corresponding digital value.

In particular, the DAC comprises a conversion block (typically, a R-2R resistor ladder network) for receiving the digital value and providing a corresponding analog value, and an amplification block (for example, an operational amplifier) for amplifying (by an appropriate amplifying factor, or gain) such analog value thereby obtaining the bias voltage. The gain of the amplification block is determined by a resistive (partition) network (for example, arranged, with respect to the operational amplifier, in feedback configuration). To obtain a sufficient gain of the amplification block, such a resistive network typically comprises a resistor having high resistance (for example, of the order of MΩ), and a resistor having a relatively low resistance (for example, of the order of hundreds of kΩ).

However, since the resistive network is subject to non negligible tolerances (for example, actual resistance values different from nominal resistance values), it may be desirable to include compensation capacitors. Furthermore, the resistor having high resistance introduces (by virtue of the relatively high number of diffusions or metallization for implementation thereof) significant parasitic capacitive couplings. However, the compensation capacitors and the parasitic capacitive couplings affect the performance of the DAC (as determining, for example, a limitation of its bandwidth, and hence of its speed).

Furthermore, these resistors (and particularly the resistor having high resistance) determine high area occupation by the DAC (and, hence, by the flash memory device), as well as an excessive electric power consumption.

SUMMARY

Thus, known approaches are generally not able to meet the modern technological requirements. An approach that includes a DAC and corresponding method for performing a digital-to-analog conversion addresses the cited drawbacks. It should be noted that, although initially designed for flash memory devices, the DAC and corresponding method may be used in any electronic device.

One aspect of an approach according to an embodiment includes a digital-to-analog converter. The digital-to-analog converter comprises a conversion block for receiving a digital value and providing a corresponding first analog value, and an amplification block for receiving said first analog value and providing a second analog value amplified by an amplification factor with respect to the first analog value. The amplification block comprises a first input terminal for receiving the first analog value, a second input terminal, and an output terminal for providing the second analog value. The amplification block further comprises a first capacitive element having a first and a second terminals connected to the output terminal and the second input terminal, respectively, of the amplification block, and a second capacitive element having a first and a second terminals connected to the second terminal of the first capacitive element and to a reference terminal, respectively. The first and second capacitive elements determine the amplification factor. The amplification block further comprises means or circuitry for recovering, at each predefined time period, an operative charge at the first terminal of the second capacitive element, and hence the second analog value to the output terminal of the amplification block.

According to an embodiment, the means or circuitry for recovering, at each predefined time period, an operative charge at the first terminal of the second capacitive element includes a further first capacitive element having a first and a second terminals, a further second capacitive element having a first terminal connected to the second terminal of the further first capacitive element and a second terminal connected to the reference terminal, and a first switching element, in a first/second configuration of the first switching element the first terminal of the further second capacitive element being connected to/disconnected from the first terminal of the second capacitive element. The circuitry for recovering also includes a second switching element, in a first/second configuration of the second switching element the first terminal of the further first capacitive element being connected to/disconnected from the output terminal of the amplification block.

According to an embodiment, the means or circuitry for recovering, at each predefined time period, an operative charge at the first terminal of the second capacitive element further includes means or switching circuitry for switching the first switching element and the second switching element in the second configuration, means or charging circuitry for charging, with the first and second switching elements in the second configuration, the first terminal of the further first capacitive element to a recovery charge, and means or switching circuitry for switching the first switching element and the second switching element in the first configuration in response to the switching to the recovery charge at the first terminal of the further second capacitive element and the charge at the first terminal of the second capacitive element being equalized to the operative charge.

According to an embodiment, the means or charging circuitry for charging the first terminal of the further first capacitive element to a recovery charge includes a third switching element in a first/second configuration of the third switching element, the first terminal of the further first capacitive element being connected to/disconnected from the reference terminal, and a fourth switching element, in a first/second configuration of the fourth switching element, the first terminal of the further second capacitive element being connected to/disconnected from the reference terminal.

The means or charging circuitry also includes means or switching circuitry for switching the first and second switching elements in the second configuration, and the third and fourth switching elements in the first configuration in response to the switching, the first terminal of the further second capacitive element being charged to a reference charge, and means or switching circuitry for switching the first, third, and fourth switching elements in the second configuration, and the second switching element in the first configuration, in response to the switching. The first terminal of the further second capacitive element is charged to the recovery charge from the reference charge.

According to an embodiment, the first capacitive element has a first capacitive value and the second capacitive element has a second capacitive value. The further first capacitive element has a further first capacitive value equal to the first capacitive value, and the further second capacitive element has a further second capacitive value equal to the second capacitive value.

Another aspect of the approach according to embodiments is directed to a flash memory device. The flash memory device comprises a plurality of memory cells, and means or circuitry for performing a selected one of a plurality of memory operations on at least a selected one of the plurality of memory cells. The means or circuitry includes the digital-to-analog converter. The second analog value comprises at least one bias voltage for biasing the at least one selected cell during the selected operation.

A different aspect of the approach according to embodiments is directed to a method for performing a digital-to-analog conversion. The method comprises receiving a digital value and providing a corresponding first analog value, receiving at a first input terminal of an amplification block the first analog value, and providing at an output terminal of the amplification block a second analog value amplified by an amplification factor with respect to the first analog value. The method also includes providing a first capacitive element having a first and second terminals connected to the output terminal and to a second input terminal, respectively, of the amplification block, and a second capacitive element having a first and a second terminals connected to the second terminal of the first capacitive element and to a reference terminal, respectively. The first and second capacitive elements determining the gain factor. The method further includes recovering, at each preset time period, an operative charge at the first terminal of the second capacitive element, and hence the second analog value to the output terminal of the amplification block.

According to an embodiment, the recovering comprises providing a further first capacitive element having a first and a second terminals, and providing a further second capacitive element having a first terminal connected to the second terminal of the further first capacitive element and a second terminal connected to the reference terminal. The recovering also includes charging the first terminal of the further first capacitive element to a recovery charge, and connecting the first terminal of the further second capacitive element charged at the recovery charge to the first terminal of the second capacitive element in response to the connection the charge at the first terminal of the further second capacitive element. The charge at the first terminal of the second capacitive element is equalized to the operative charge.

According to an embodiment, charging the first terminal of the further first capacitive element to a recovery charge further includes connecting the first terminal of the further first capacitive element and the first terminal of the further second capacitive element to the reference terminal in response to the connection. The first terminal of the further second capacitive element is charged to a reference charge. Charging the first terminal also includes connecting the first terminal of the further first capacitive element to the output terminal of the amplification block in response to the connection. The first terminal of the further second capacitive element is charged to the recovery charge from the reference charge.

DETAILED DESCRIPTION

The approach according to one or more embodiments, as well as further features and the related advantages, will be best understood with reference to the following detailed description, given purely by way of non limitative example only, to be read in conjunction with the accompanying figures (wherein corresponding elements are indicated by same or similar references and their explanation is not repeated for the sake of brevity).

Figure 1:
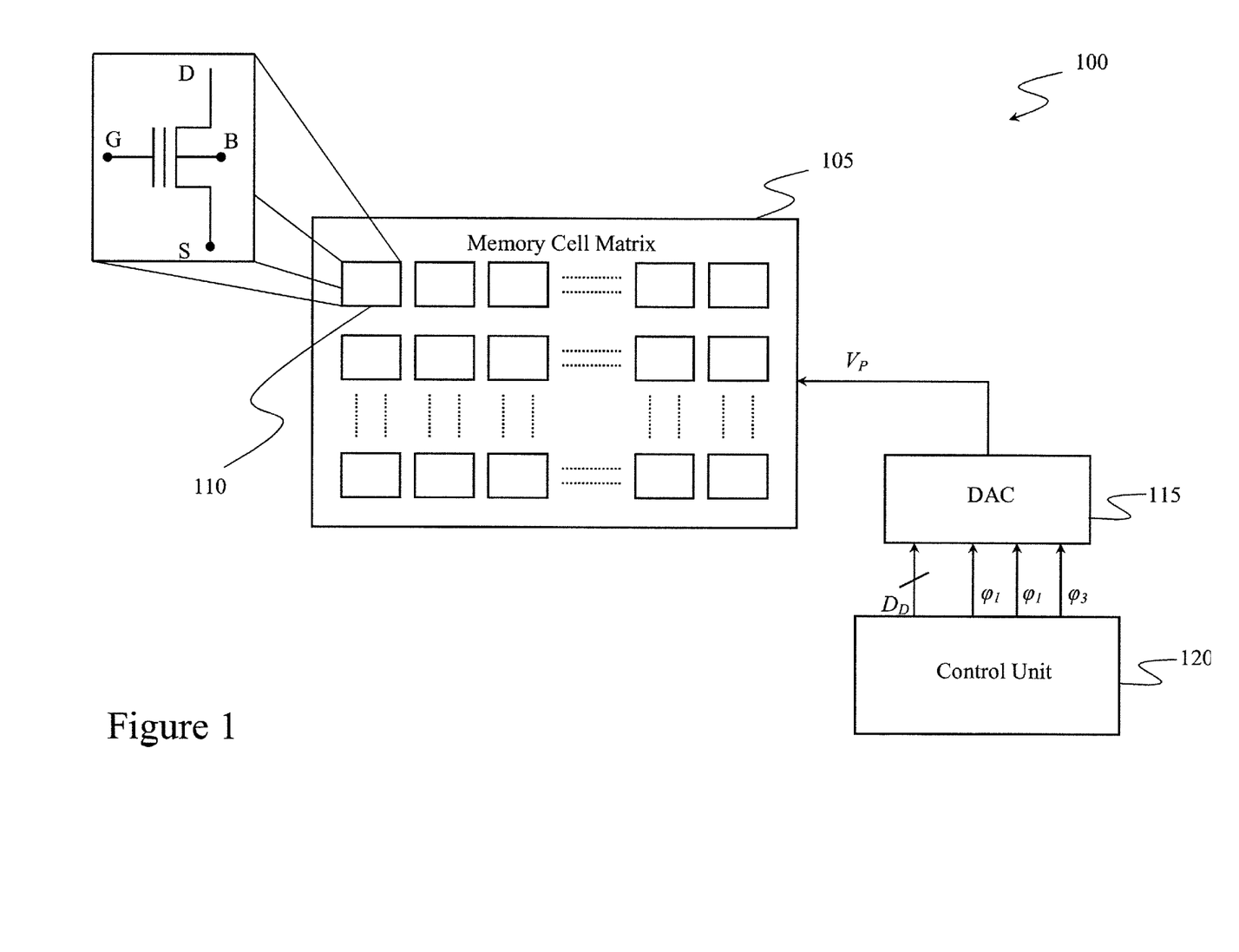
FIG. 1 is a block diagram of a flash memory device according to an embodiment of the invention.

With particular reference to FIG. 1, a flash memory device 100 (for example, a NOR flash memory device) according to an embodiment is illustrated. The flash memory device 100, integrated in a chip of semiconductor material, comprises a matrix 105 of electrically erasable and programmable memory cells 110.

Each memory cell 110 typically comprises a floating gate MOS transistor (only one shown in the figure, and illustrated by a typical circuit representation thereof), which has a bulk terminal B, a drain terminal D, a source terminal S, a gate terminal G, and a floating gate region electrically insulated. Each memory cell 110 is adapted to store a corresponding information bit, represented by a threshold voltage of the corresponding floating gate MOS transistor (in turn depending on the amount of electric charges trapped in the floating gate).

The flash memory device 100 comprises peripheral components (for example, decoders, multiplexers, buffers, sense amplifiers, converters, control unit) configured to access selected memory cells 110 and perform operations on the same (for example, programming, erasing, reading, soft-programming, programming verify, erasing verify, reading verify and soft-programming verify). To execute each one of these operations (or memory operations), the terminals of the floating gate MOS transistor of the memory cell 110 (and, particularly, the gate G and/or bulk B terminals) are biased (for the all time length $T_{OP}$ of the selected memory operation) to respective bias voltages $V_P$.

For example, during the erasing, programming, programming verify, erasing verify, reading verify, and soft-programming verify operations, the bias voltage $V_P$ applied to the gate terminals G of the selected memory cells 110 is equal to −10V, 9V, 6.3V, 4.4V, 5.3V and 2.8V, respectively, whereas during the erasing/soft-programming operation, the bias voltage $V_P$ applied to the bulk B/gate G terminals comprises (voltage) pulses having progressively increasing values (for example, from 4V to 10.75V with a 0.3V step, and from 2.5V to 7V with a 0.125V step, respectively).

In the following, for the sake of exposition brevity, only components and aspects of the flash memory device 100 relevant to the understanding of the invention (i.e., relating to the terminals biasing) will be introduced and described.

The flash memory device 100 comprises a digital-to-analog converter (hereinafter, DAC) 115 for generating the bias voltage $V_P$ from a corresponding digital value $D_D$ and biasing the selected memory cells 110 (as conceptually represented in the figure by the generic arrow connection between the DAC and the matrix 105), and a control unit 120 for providing the digital value $D_D$ to the DAC 115 according to the memory operation to be performed (and, hence, according to the required corresponding bias voltage $V_P$). Preferably, as illustrated, the control unit 120 also provides one or more (e.g., three) control signals $\phi 1, \phi 2, \phi 3$ to the DAC 115. As will be better discussed in the following, these control signals $\phi 1, \phi 2, \phi 3$ allow a recovery of electric charge in the DAC 115.

Figure 2:
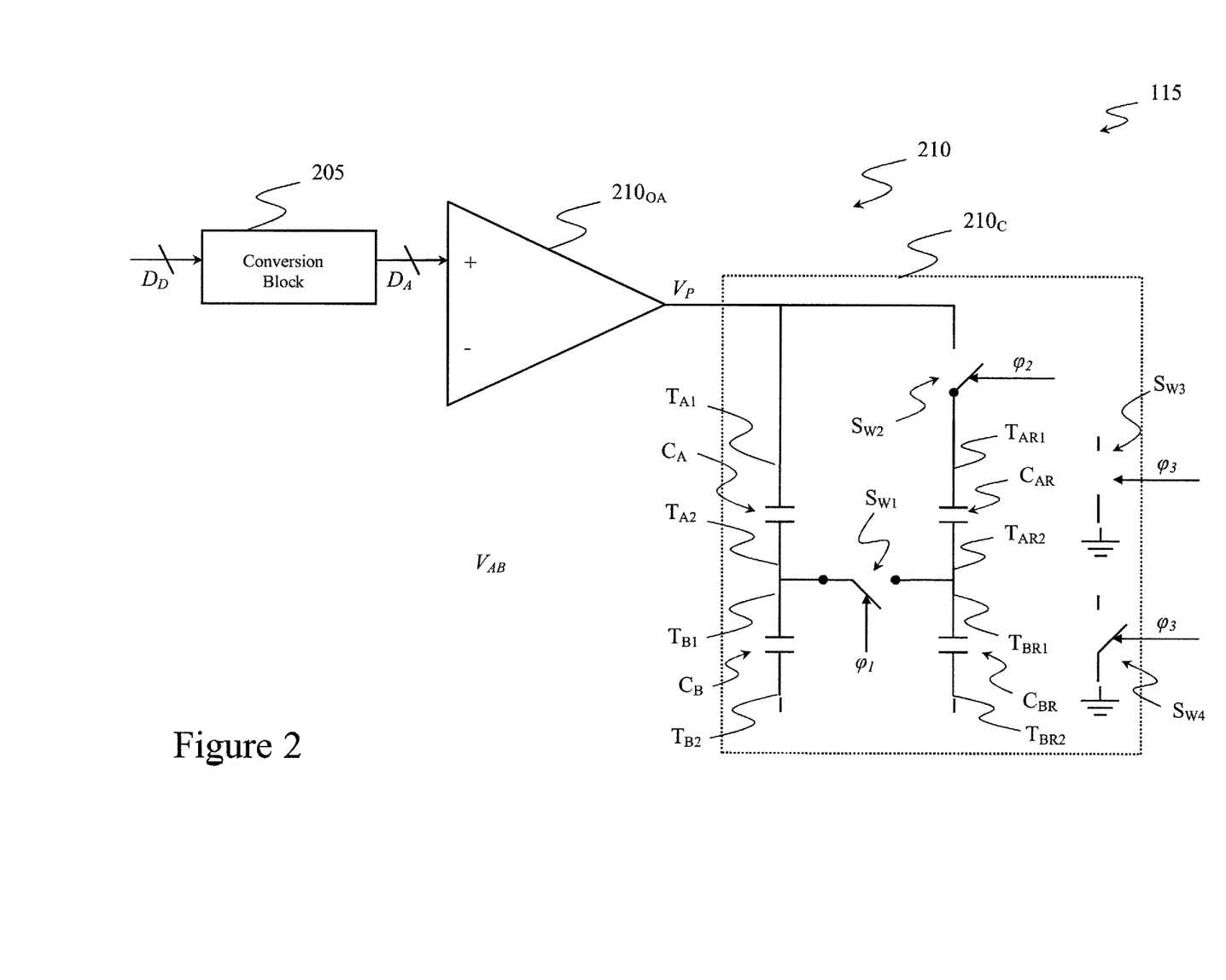
FIG. 2 is a schematic diagram of a DAC of the flash memory device according to an embodiment of the invention.

With reference now to FIG. 2, the DAC 115 according to an embodiment is schematically illustrated.

The DAC 115 comprises a conversion block 205 (e.g., a R-2R resistor ladder network) for receiving the digital value $D_D$ and providing a corresponding (voltage or current) analog value $D_A$, and an amplification block 210 for amplifying (by a suitable amplifying factor, or gain G) such analog value $D_A$ thereby obtaining said bias voltage $V_P$.

The amplification block 210 comprises, in the illustrated embodiment, an operational amplifier $210_{OA}$. The operational amplifier $210_{OA}$ (illustrated in FIG. 2 by its conventional circuit symbol) is not limiting for the embodiments, as it may be implemented according to specific design requirements (for example, architecture of the conversion block 205, and/or electrical quantity, voltage or current, used to provide the analog value $D_A$). For example, in the embodiment herein considered, wherein the conversion block 205 has a R-2R resistor ladder architecture (so that the analog value $D_A$ is provided in the form of a current), the operational amplifier $210_{OA}$ may be implemented by a transconductance input stage and an amplifying output stage arranged in cascade (not shown). The operational amplifier $210_{OA}$ comprises a non-inverting input terminal (denoted by the sign "+" in the figure) for receiving the analog value $D_A$ from the conversion block 205, an inverting input terminal (denoted by the sign "−" in the figure), and an output terminal for providing the bias voltage $V_P$.

In the proposed approach, the amplification block 210 further comprises a capacitive network $210_C$ connected (or, in part, selectively connected, as discussed below) to the operational amplifier $210_{OA}$. More particularly, such capacitive network $210_C$ comprises a capacitor (or other capacitive element) $C_A$ whose terminals $T_{A1}$ and $T_{A2}$ are connected to the output terminal and to the inverting input terminal, respectively, of the operational amplifier $210_{OA}$, and a further capacitor (or other capacitive element) $C_B$ whose terminals $T_{B1}$ and $T_{B2}$ are connected to the terminal $T_{A2}$ of the capacitor $C_A$ (and hence to the inverting input terminal of the operational amplifier $210_{OA}$) and to a reference terminal (preferably, a ground terminal providing a ground voltage, for example 0V), respectively.

In other words, the operational amplifier $210_{OA}$ and the capacitors $C_A$, $C_B$ define a feedback configuration, wherein the gain G of the amplification block 210 depends on the capacitance values of the capacitors $C_A$, $C_B$ (hereinafter denoted by $C_A$, $C_B$, respectively), namely:

$$G = \frac{(C_A + C_B)}{C_A}$$

Moreover, the capacitors CA, CB define a capacitive partition network between the output terminal of the operational amplifier 210OA and the ground terminal, so that the voltage at the terminals TA2, TB1 (that, as representing also the voltage at the inverting input terminal of the operational amplifier 210OA, will be referred to as input voltage VAB hereinafter) depends on the bias voltage VP and on the ratio between the capacitance values CA, CB of the capacitors CA, CB, namely:

$$V_{AB} = V_P \frac{C_A}{C_A + C_B} = V_P \frac{1}{G}$$

The use of a capacitive network rather than, as in the known approaches, of a resistive network, has several advantages. In particular, for the same gain G, the making of a capacitive network determines, with respect to a resistive network, lower tolerances and lower parasitic capacitive couplings (and therefore fewer limitations in terms of bandwidth), as well as greatly reduced electric power consumption.

Furthermore, for the same gain G, a capacitive network involves area occupation significantly lower than a resistive network. For example, a capacitive network with capacitance values $C_A$, $C_B$ equal to 150 fF, 3.45 pF, respectively, occupies an area of the order of 1300 μm², whereas a resistive network would, for the same gain (G≈23 in the example at issue), would occupy an area of the order of 4000 μm².

As shown in FIG. 2, the capacitive network $210_C$ further comprises a (e.g., capacitive) recovery section for periodically recovering (for example, at each recovery period $T_R$), the charge at the terminal $T_{A2}$, $T_{B1}$ to an operative value thereof throughout the execution of the memory operation (i.e., for the all the time length $T_{OP}$)—with such operative value that represents the expected charge value, by virtue of the proposed circuit configuration, when the bias voltage $V_P$ is at an ideal value $\underline{V}_P$ depending on the memory operation to be performed.

Indeed, due to leakage phenomena that affect the capacitors, the charge at the terminal $T_{A2}$, $T_{B1}$ decreases over time with respect to its operative value. This affects the bias voltage $V_P$ at the output terminal of the operational amplifier $210_{OA}$ (with respect to its ideal value $\underline{V}_P$), thus impairing the biasing of the selected memory cells (and, therefore, the operation of the flash memory device 100).

The recovery period $T_R$, not limiting for the embodiments, may be chosen according to specific design requirements. Preferably, the recovery period $T_R$ is sufficiently lower than the time length $T_{OP}$ to allow several recovery stages during the execution of a same memory operation.

In the exemplary illustrated embodiment, the recovery capacitive section comprises a recovery capacitor (or other capacitive element) $C_{AR}$ having a terminal $T_{AR1}$ adapted to be selectively connected to the output terminal of the operational amplifier $210_{OA}$ or to the reference terminal, and a terminal $T_{AR2}$ adapted to be selectively connected to the terminals $T_{A2}$, $T_{B1}$ (and hence to the inverting input terminal of the operational amplifier $210_{OA}$) or to the reference terminal. The recovery capacitive section further includes a further recovery capacitor (or other capacitive element) $C_{BR}$ having a terminal $T_{BR1}$ connected to the terminal $T_{AR2}$ (and therefore also selectively connected to the inverting input terminal of the operational amplifier $210_{OA}$ or to the reference terminal), and a terminal $T_{BR2}$ connected to the reference terminal.

Advantageously, the capacitance values of the recovery capacitors $C_{AR}$, $C_{BR}$ (hereinafter, denoted by $C_{AR}$, $C_{BR}$, respectively) are chosen, respectively, equal to the capacitance values $C_R$, $C_B$ of the capacitors $C_A$, $C_B$ (i.e., $C_A=C_{AR}$ and $C_B=C_{BR}$), so that the gain G of the amplification block 210 is unchanged even when the capacitive recovery section is connected to the operational amplifier $210_{OA}$. In this condition, in fact, as can be easily verified, with the terminal $T_{AR1}$ connected to the output terminal of the operational amplifier $210_{OA}$ and the terminals $T_{AR2}$, $T_{BR1}$ connected to the terminals $T_{A1}$, $T_{B1}$ the gain G of the amplification block 210 is still equal to:

$$G = \frac{(C_A + C_B)}{C_A}$$

Back to FIG. 2, the capacitive network 210C also comprises one or more (e.g., four) switching elements (in the following, switches) SW1, SW2, SW3, SW4 for enabling the selective connection of the terminals TAR1 and TAR2, TBR1.

As visible in the figure, the switch $S_{W1}$ enables/disables the connection between the terminals $T_{AR2}$, $T_{BR1}$ and the terminals $T_{A2}$, $T_{B1}$ according to the control signal $\phi_1$ (for example, according to an assertion/de-assertion thereof), the switch $S_{W2}$ enables/disables the connection between the terminal $T_{AR1}$ and the output terminal of the operational amplifier $210_{OA}$ according to the control signal $\phi_2$ (for example, according to an assertion/de-assertion thereof), and the switches $S_{W3}$, $S_{W4}$ enable/disable the connection between the terminals $T_{AR1}$, $T_{BR1}$, respectively, and the reference terminal according to the control signal $\phi_3$ (for example, according to an assertion/de-assertion thereof).

In the following, for the sake of ease, the effects of charge transfers (to and from the terminal $T_{A2}$, $T_{B1}$) on the bias voltage $V_P$ will be discussed without taking into account the feedback action (since, as far as the discussed aspects of the invention are concerned, a discussion that takes into account such an action would lead to similar considerations). Therefore, in the following, the charge transfers (to and from the terminal $T_{A2}$, $T_{B1}$) are considered to affect only the input voltage $V_{AB}$, with the bias voltage $V_P$ that instead will be considered constant (and substantially equal to its ideal value $\underline{V}_P$).

Figure 3:
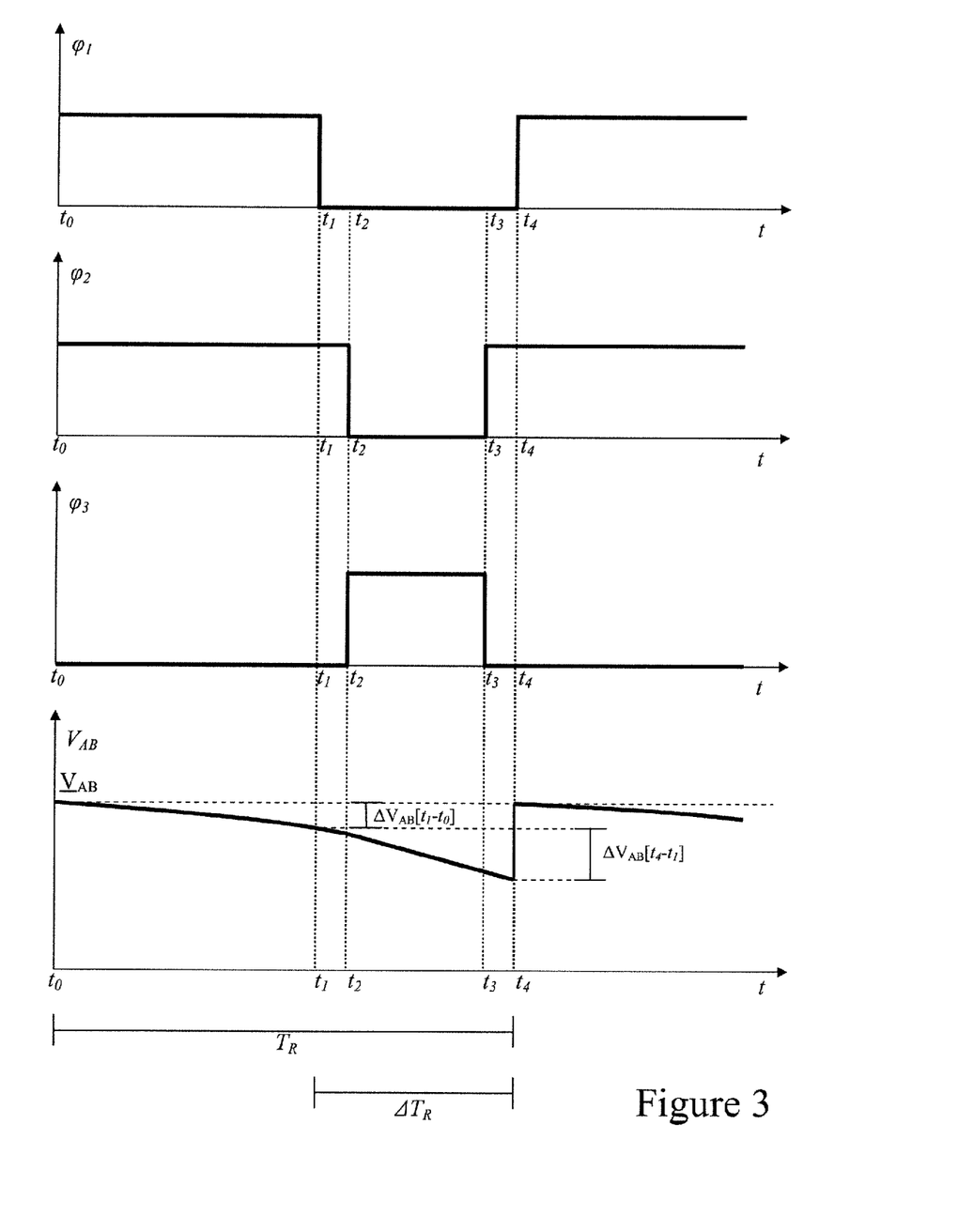
FIG. 3 is a graph of qualitative time diagrams of control signals and of an input voltage of an amplification block of the DAC according to an embodiment of the invention.

The operation of the DAC 115 may be summarized as follows (with joint reference to FIG. 3, which shows, according to an embodiment, qualitative time diagrams of the control signals $\phi_1, \phi_2, \phi_3$ and of the input voltage $V_{AB}$ in a generic biasing phase).

At the start of the selected memory operation (time instant $t_0$), and up to a following time instant decreeing the start of the recovery phase (time instant $t_1$), the control signals $\phi_1, \phi_2$ are asserted (for example, at a high logic level), and the control signal $\phi_3$ is de-asserted (for example, at a low logic level). In this condition, at the time instant $t_0$, the bias voltage $V_P$ is at the ideal value $\underline{V}_P$ (depending on the ongoing memory operation), and the input voltage $V_{AB}$ is equal to an ideal value thereof $\underline{V}_{AB}$ (also depending on the ongoing memory operation), namely:

$$\underline{V}_{AB} = V_P \frac{C_A}{C_A + C_B} = \underline{V}_P \frac{1}{G}$$

Because of the dispersion phenomena (for example, leakage currents IL, not shown) affecting the capacitors CA, CB, and CAR, CBR, between the time instant t0 and the time instant t4 (i.e., the recovery period TR), and neglecting (as previously mentioned) the feedback action, the input voltage VAB decreases over time, and differs with respect to its ideal value VAB.

In particular, between the time instant $t_0$ and the time instant $t_1$, the capacitors $C_A$, $C_B$ and $C_{AR}$, $C_{BR}$ (connected to each other by the switch $S_{W1}$), i.e. the terminals $T_{A2}$, $T_{B1}$ and $T_{AR2}$, $T_{BR1}$, will experience a loss of electric charge by an amount $Q_1[t_1-t_0]$ equal to:

$$Q_1(t_1 - t_0) = \frac{I_L \times (t_1 - t_0)}{2}$$

Similarly, between the time instant t0 and the time instant t1, the terminals TA2, TB1 and TAR2, TBR1 (connected to each other by the switch SW1), and hence the input voltage VAB, experience a voltage decrease by an amount $\Delta$VAB[t1−t0] equal to:

$$\Delta V_{AB}[t_1 - t_0] = \frac{I_L(t_1 - t_0)}{(C_A + C_B + C_{AR} + C_{BR})}$$

or, in the example at issue wherein $C_A=C_{AR}$ and $C_B=C_{BR}$:

$$\Delta V_{AB}[t_1 - t_0] = \frac{I_L(t_1 - t_0)}{2(C_A + C_B)}$$

At the time instant t1, the control signal $\phi$1 is de-asserted (with the control signal $\phi$2 still asserted and the control signal $\phi$3 still de-asserted). In this condition, the capacitors CA and CB, in series with each other, and the recovery capacitors CAR and CBR, also in series with each other, are in parallel. As will be clear shortly, the de-assertion of the control signal $\phi$1 before the de-assertion of the control signal $\phi$2 and of the assertion of the control signal $\phi$3 avoids unwanted connections of the terminals TA2, TB1 to the ground terminal (and the subsequent discharging thereof to the ground voltage).

Subsequently, time instant $t_2$, the control signal $\phi_2$ is de-asserted and the control signal $\phi_3$ is asserted (with the control signal $\phi_1$ still de-asserted). In this condition, the recovery capacitors $C_{AR}$, $C_{BR}$ are "insulated" (i.e., disconnected) from the capacitors $C_A$, $C_B$ and from the operational amplifier $210_{O4}$, and the terminals $T_{AR1}$ and $T_{AR2}$, $T_{BR1}$ are charged to a reference charge. In the exemplary considered embodiment, the terminals $T_{AR1}$ and $T_{AR2}$, $T_{BR1}$, connected to the ground terminal, are discharged down to the ground voltage. In this way, the voltage across the recovery capacitors $C_{AR}$, $C_{BR}$ is initialized at the ground voltage.

Such initialization, although not necessary in basic embodiments (wherein the switches $S_{W3}$, $S_{W4}$ and the control signal $\phi_3$ may also be omitted), is particularly advantageous since it allows quickly updating the input voltage $V_{AB}$ to an ideal value $\underline{V}_{AB}^*$ different from (i.e., higher or lower than) the ideal value $\underline{V}_{AB}$. This may happen, for example, if, during a recovery phase, the bias voltage $V_P$ has to be changed (from the ideal value $V_P$ to a different ideal value $V_P^*$) for performing a different memory operation.

At a time instant $t_3$, sufficiently following the time instant $t_2$ to allow the complete initialization of the voltage across the recovery capacitors $C_{AR}$, $C_{BR}$, the control signal $\phi_2$ is asserted again and the control signal $\phi_3$ is de-asserted again (with the control signal $\phi_1$ still de-asserted).

In this condition, the terminal $T_{AR1}$ is connected again to the output terminal of the operational amplifier $210_{O4}$ for receiving the bias voltage $V_P$. In this way, a partition of the bias voltage $V_P$ will be set at the terminals $T_{AR2}$, $T_{BR1}$—as will be easily understood, in the absence of initialization of the voltage across the recovery capacitors $C_{AR}$, $C_{BR}$ the terminals $T_{AR2}$, $T_{BR1}$ may be charged more slowly to this voltage.

In particular, the voltage at the terminal $T_{AR2}$, $T_{BR1}$ is equal to:

$$\underline{V}_P = \frac{C_{AR}}{(C_{AR} + C_{BR})}$$

or, in the example at issue wherein $C_A = C_{AR}$ and $C_B = C_{BR}$:

$$\underline{V}_P = \frac{C_{AR}}{(C_A + C_B)}$$

This voltage at the terminal TAR2, TBR1 is equivalent to an electric charge that, as will be explained shortly, is used for recovering the operative charge at the terminal TA2, TB1 (hereinafter, recovery charge).

At the same time (i.e., between the time instant $t_1$ and the time instant $t_4$), the capacitors $C_A$, $C_B$ (not connected to the capacitors $C_{AR}$, $C_{BR}$), i.e. the terminals $T_{A2}$, $T_{B1}$ and $T_{AR2}$, $T_{BR1}$, experience a loss of electric charge by an amount $Q_2[t_4-t_1]$ equal to:

$$Q_2[t_4-t_1] = I_L \times (t_4-t_1)$$

Therefore, the total electric charge $QT[t4-t0]$ lost between the time instant t0 and the time instant t4 is equal to:

$$Q_T[t_4-t_0] = Q_1[t_1-t_0] + Q_2[t_4-t_1] =$$

$$= \frac{I_L \times (t_1-t_0)}{2} + I_L \times (t_4-t_1) =$$

$$= \frac{I_L \times (T_R - \Delta T_R)}{2} + I_L \times \Delta T_R =$$

$$= \frac{I_L \times (T_R + \Delta T_R)}{2}$$

being $T_R = (t_4-t_0)$ the recovery period, and $\Delta T_R = (t_4-t_1)$).

Similarly, between the time instant t1 and the time instant t4, the input voltage VAB at the terminals TA2, TB1 (which are disconnected from the terminals TAR2, TBR1), experience a voltage decrease by an amount $\Delta V_{AB}[t4-t1]$ equal to $$\Delta V_{AB}[t_4 - t_1] = \frac{I_L(t_4 - t_1)}{(C_A + C_B)}$$

Therefore, the overall change of the voltage at the terminal TA2, TB1 during a whole recovery period TR=t4−t0 is given by:

$$\Delta V_{AB}(t_4 - t_0) = \Delta V_{AB}(t_4 - t_1) + \Delta V_{AB}(t_1 - t_0) =$$

$$= \frac{I_L(T_R - \Delta T_R)}{2(C_A + C_B)} + \frac{I_L(\Delta T_R)}{(C_A + C_B)} =$$

$$= \frac{I_L(T_R + \Delta T_R)}{2(C_A + C_B)}$$

Finally, time instant t4, the control signal $\phi 1$ is asserted again (with the control signal $\phi 2$ still asserted and the control signal $\phi 3$ still de-asserted). The assertion of the control signal $\phi 1$ enables the connection between the terminals TA2, TB1 and the terminals TAR2, TBR1, and the equalization of the corresponding electric charges.

Ideally, the DAC 115 may be sized and configured in such a way that this equalization restores the terminal $T_{A2}$, $T_{B1}$ to the ideal value $\underline{V}_{AB}$ (i.e., in terms of electric charge, to the operative charge).

In the practical example herein considered, however, at full performance (i.e., after a number of recovery periods, and hence of equalizations), the input voltage $V_{AB}$ at the time instant $t_0$ of a current recovery period takes a value $V_{ABf}$ lower than the ideal value $\underline{V}_{AB}$ and, as can be easily verified, equal to:

$$\underline{V}_{ABf} = \underline{V}_P \frac{C_A}{(C_A + C_B)} - \frac{I_L \times (T_R + \Delta T_R)}{2(C_A + C_B)}$$

whereas the input voltage $V_{AB}$, at the time instant $t_4$ of the same recovery period, takes a value $V_{ABi}$ that, by virtue of the electric charge lost due to leakage currents $I_L$ during the recovery period, is lower than the value $V_{ABf}$ by the above mentioned amount $\Delta V_{AB}[t_4-t_0]$, namely:

$$\underline{V}_{ABi} = \underline{V}_{ABf} - \Delta V_{AB}[t_4 - t_0] =$$

$$\underline{V}_{ABi} = \underline{V}_P \frac{C_A}{(C_A + C_B)} - \frac{I_L \times (T_R + \Delta T_R)}{2(C_A + C_B)} - \frac{I_L(T_R + \Delta T_R)}{2(C_A + C_B)} =$$

$$\underline{V}_{ABi} = \underline{V}_P \frac{C_A}{(C_A + C_B)} - \frac{I_L(T_R + \Delta T_R)}{(C_A + C_B)}$$

In terms of electric charge, in the practical example herein considered, at full performance, the charge at the terminal TA2, TB1 differs from the operative charge (similarly to that discussed above, in terms of voltage, for the input voltage VAB).

Because of the recovery capacitors $C_{AR}$, $C_{BR}$, the adjustment of the bias voltage $V_P$ of the DAC 115 is affected by an error $E_R$ given by:

$$E_R = G \frac{I_L(T_R + \Delta T_R)}{(C_A + C_B)}$$

According to specific design requirements, this error ER may be arbitrarily reduced (for example, by acting on parameters such as TR, CA and/or CB). The use of the recovery section is advantageous as it may ensure high speed and accuracy of the DAC 115 when "generating" the bias voltage $V_P$, while ensuring very low area occupation, costs, and power consumption.

As mentioned above, for the sake of ease, the effects of charge transfers (to and from the terminal $T_{A2}$, $T_{B1}$) on the bias voltage $V_P$ and on the input voltage $V_{AB}$ have been discussed by deliberately ignoring the feedback action. Briefly, taking into consideration the feedback action too, the aforesaid charge transfers affect, ideally, only the bias voltage $V_P$, which is subject to variations (that are unwanted, in the described application) adapted to keep the input voltage $V_{AB}$ stable.

Anyway, as will be apparent to a person skilled in the art, a discussion that takes into account the feedback action would lead to considerations and results similar to those described above. To satisfy local and specific requirements, a person skilled in the art may apply to the approach described above many logical and/or physical modifications and alterations.

More specifically, although this approach has been described with a certain degree of particularity with reference to one or more embodiments thereof, it should be understood that various omissions, substitutions and changes in the form and details as well as other embodiments are possible. Particularly, different embodiments of the invention may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment may be incorporated in any other embodiment as a matter of general design choice. In any case, ordinal qualifiers or the like are merely used as labels for distinguishing elements with the same name but do not connote any priority, precedence or order. Moreover, the terms including, comprising, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

The invention claimed is:

1. A digital-to-analog converter comprising:
    a conversion block configured to receive a digital value and provide a corresponding first analog value;
    an amplification block configured to receive the first analog value and provide a second analog value amplified by an amplification factor with respect to the first analog value, said amplification block comprising a first input terminal configured to receive the first analog value, a second input terminal, and an output terminal configured to provide the second analog value;
    said amplification block further comprising
        a first capacitive element having first and second terminals connected to the output terminal and the second input terminal, respectively, and
        a second capacitive element having first and second terminals connected to the second terminal of the first capacitive element and to a reference terminal, respectively,
        said first and second capacitive elements determining the amplification factor; and
    recovery circuitry configured to recover, at each of a plurality of predetermined time periods, an operative charge at the first terminal of said second capacitive element, and, based upon the operative charge, the second analog value to the output terminal of said amplification block.

2. The digital-to-analog converter according to claim 1, wherein said recovery circuitry comprises:
    a further first capacitive element having first and second terminals;
    a further second capacitive element having a first terminal connected to the second terminal of the further first capacitive element, and a second terminal connected to the reference terminal;
    a first switching element, in a first or second configuration of the first switching element, the first terminal of the further second capacitive element being respectively connected to or disconnected from the first terminal of the second capacitive element; and
    a second switching element, in a first or second configuration of the second switching element, the first terminal of the further first capacitive element being respectively connected to or disconnected from the output terminal of said amplification block.

3. The digital-to-analog converter according to claim 2, wherein said recovery circuitry further is configured to
    switch the first switching element and the second switching element in the second configuration;
    charge, with the first and second switching elements in the second configuration, the first terminal of the further first capacitive element to a recovery charge; and
    switch the first switching element and the second switching element in the first configuration, in response to the switching, the recovery charge at the first terminal of the further second capacitive element and the charge at the first terminal of the second capacitive element being equalized to the operative charge.

4. The digital-to-analog converter according to claim 3, wherein recovery circuitry further comprises:
    a third switching element, in a first or second configuration of the third switching element, the first terminal of the further first capacitive element being respectively connected to or disconnected from the reference terminal; and
    a fourth switching element, in a first or second configuration of the fourth switching element, the first terminal of the further second capacitive element being respectively connected to or disconnected from the reference terminal;
    said recovery circuitry being configured to
        switch the first and second switching elements in the second configuration and the third and fourth switching elements in the first configuration, in response to the switching, the first terminal of the further second capacitive element being charged to a reference charge, and switch the first, third, and fourth switching elements in the second configuration and the second switching element in the first configuration, in response to the switching, the first terminal of the further second capacitive element being charged to the recovery charge from the reference charge.

5. The digital-to-analog converter according to claim 2, wherein said first capacitive element has a first capacitive value and said second capacitive element has a second capacitive value, and wherein said further first capacitive element has a further first capacitive value equal to the first capacitive value and said further second capacitive element has a further second capacitive value equal to the second capacitive value.

\* \* \* \* \*